United States Patent [19]

Bailey

[11] 3,992,702
[45] Nov. 16, 1976

[54] CODE CONVERSION ARRANGEMENTS FOR ADDRESSES TO FAULTY MEMORY LOCATIONS

[75] Inventor: Nigel Ronald Hassall Bailey, Stevenage, England

[73] Assignee: International Computers Limited, Stevenage, England

[22] Filed: Apr. 16, 1975

[21] Appl. No.: 568,691

[30] Foreign Application Priority Data
May 1, 1974 United Kingdom............ 18988/74

[52] U.S. Cl. ..................... 340/173 BB; 340/172.5
[51] Int. Cl.² ................. G11C 8/00; G11C 29/00
[58] Field of Search ............ 340/173 BB, 173 AM, 340/173 R, 172.5

[56] References Cited
UNITED STATES PATENTS

| | | | |
|---|---|---|---|
| 3,573,751 | 4/1971 | De Lisle........................ | 340/173 BB |
| 3,659,275 | 4/1972 | Marshall....................... | 340/173 BB |

OTHER PUBLICATIONS

Abrahamsen, Dynamic Redundancy and Repair System for Large Mass Storage Unit, IBM Technical Disclosure Bulletin, vol. 17, No. 10, 3/75, pp. 2841–2843.

*Primary Examiner*—Stuart N. Hecker
*Attorney, Agent, or Firm*—George R. Douglas, Jr.

[57] ABSTRACT

A code converter comprising a pair of memories which are addressed by respective halves of the input code. The outputs of the memories are concatenated to provide an address for a third memory. The output of the third memory provides the output code. The converter is initially set by applying the desired input codes in sequence, and writing the contents of a counter into the addressed locations of the three memories, the counter being incremented for each new input code. A particular example of the use of such a converter is for assigning replacement addresses in an auxiliary memory for faulty locations in a main memory.

5 Claims, 2 Drawing Figures

CODE CONVERSION ARRANGEMENTS FOR ADDRESSES TO FAULTY MEMORY LOCATIONS

BACKGROUND OF THE INVENTION

This invention relates to digital code conversion arrangements. More particularly, the invention is concerned with providing a code conversion arrangement in which the relationship between the input and output codes can be readily be varied according to requirements.

It is known to construct a code conversion arrangement in the form of a tree of logical gates. However, if such an arrangement is to operate in a variable manner, a multiplicity of such logical trees must be provided, which results in a considerable degree of cost and complexity.

Another way of implementing a code conversion arrangement is to use a memory as a conversion table, the memory being addressed by the input codes and storing the desired output codes at the appropriate locations. The relationship between the input and output codes can then easily be varied, simply by re-writing the contents of the memory. However, where the number of possible input codes is large, the memory must also be large. Moreover, in many applications, it is only necessary at any given time to assign output codes to a relatively small subset of the possible input codes, and so many of the locations of the memory will not be used. Thus, this method tends to be extravagant in its use of memory space.

It is also possible to use a contents addressable memory (CAM) instead of a conventionally addressable memory. However, in the present state of the art, contents addressable memories are rather expensive.

SUMMARY OF THE INVENTION

According to one aspect of the invention, a digital code conversion arrangement comprises: at least two memories, each with a plurality of storage locations; means for addressing the memories with respective portions of an input code, to select a storage location in each memory; means operative in an initialising mode for entering data from a data source, into the currently selected locations of the memories; and means operative in an operating mode to read out the data from the currently selected storage locations and to derive an output code from the data so read out.

The invention finds particular application in a memory system, for assigning replacement locations in an auxiliary memory for faulty locations in a main memory. In this case, the input codes are main memory addresses, and the output codes are the addresses of the corresponding replacement locations in the auxiliary memory.

Thus, according to a second aspect of the invention, a memory system comprises: a main memory having a plurality of addressable storage locations some of which may be faulty; an address register for addressing the main memory; an auxiliary memory having a smaller plurality of addressable locations; at least two further memories each with a plurality of addressable storage locations, the further memories being addressed with respective portions of the contents of the address register so as to select a storage location is each of those memories; means operative to enter data from a data source into the currently selected locations of the further memories; means operative to read out the data from the currently selected locations of the further memories to produce an address which is applied to the auxiliary memory; and gating means connected to the data outputs of the main and auxiliary memories and operable to select one or other of those outputs in accordance with whether the currently addressed location in the main memory is operative or faulty respectively.

BRIEF DESCRIPTION OF THE DRAWINGS

One embodiment of the invention will now be described, by way of example, with reference to the accompanying drawing, in which.

DESCRIPTION OF THE PREFERRED EMBODIMENT.

Figure 1:
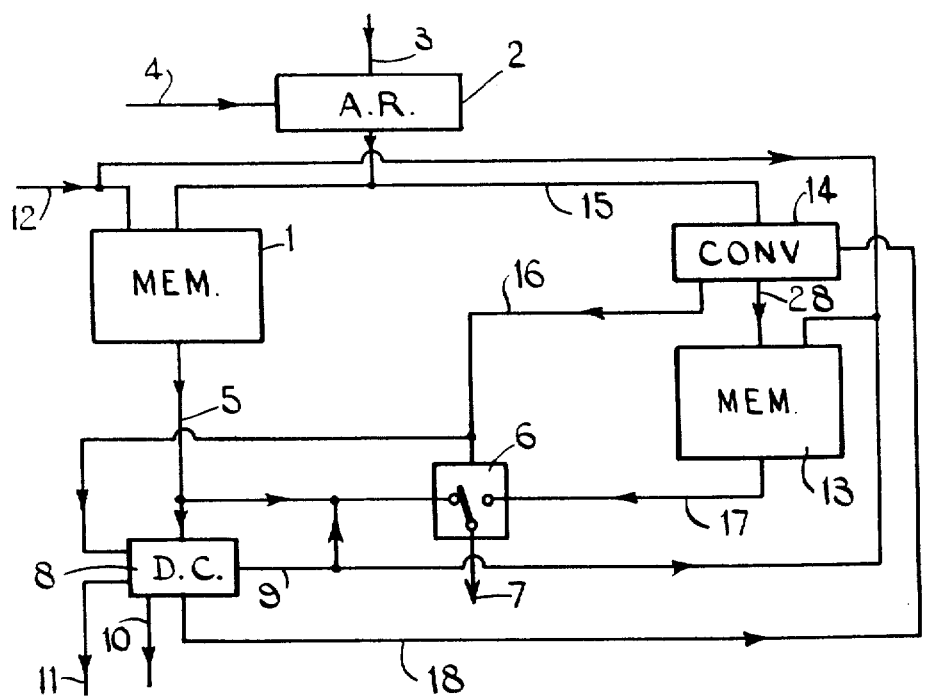
FIG. 1 is a schematic block diagram of a memory system.

Data is stored in a plurality of storage locations of a main memory 1 (FIG. 1). Each storage location is addressable and may contain one or more words, or bytes of data. The memory may be engineered in any convenient technology, such as magnetic cores or films, or MOS or other semiconductor elements.

For the purpose of the present description, it will be assumed that the memory is part of a computer system (not shown) and that it is controlled by an address register 2. The register 2 receives from the central processor of the computer system an address word on line 3 and a read or write command on line 4. In the case of a write command, the data on an input line 12 is written into the addressed location of the memory 1, while in the case of a read command the contents of the addressed location are read out on to an output line 5. The data on output line 5 is applied to a gating arrangement 6, which is normally set so as to feed this data to an output highway 7. The highway 7 may be connected to the central procesor, for example, so that the selected data may be processed.

It will be assumed that the data in the memory 1 is encoded in one of the known error detecting and correcting codes and the data which is read out on the line 5 is applied to an appropriate data checking device 8. If the device 8 detects an error, it reconstructs the correct data and applies it over line 9 to the gating arrangement 6. It also generates an error signal on line 10 to indicate to the central processor that the data previously read on to the output highway 7 was corrupt and should be replaced by the reconstructed data.

It will be appreciated that the correct data is provided to the central processor, but a longer time is required in comparison with the time normally required for reading out one word, or other unit, of data. Firstly, the correct word has to be reconstructed from the corrupt form and this requires a substantial amount of logical manipulation with many of the usual codes. Secondly, the corrupt word has to be cancelled and replaced by the correct word. This may involve back tracking on one or more instructions of the central processor. If the corruption occurred as a result of a stable fault related to the particular memory location, as opposed to, say a random noise spike, this long reading period will arise each time that the particular location is accessed.

The most likely fault is that one bit position of the storage location will fail. For example, it will not give any output or it will assume a 'stuck at 1' state. Even a relatively simple redundant code will provide for correction of such an error. However, if the fault is in the means by which the storage location is accessed, for example, several of the bit locations may fail. It is likely that correction of such an error will not be possible and the data checking device 8 will signal the central processor over line 11 that it has detected an error which it cannot correct. This signal will stop the program and recovery routines will be initiated either automatically, or by operator intervention, to attempt to circumvent the error condition. Even if this is successful, the faulty location may cause the same situation to arise on the next program which is used.

Furthermore, the occurrence of an error signal on either of lines 10 and 11 may automatically call diagnostic routines which will record details of the error in the main memory, or another store, to assist in the tracing and repair of the fault at some later time. The use of these routines will further increase the time lost by an error. Accordingly, it will be appreciated that leaving faulty locations in use can cause an appreciable reduction in the useful throughput of the computer system, even when the number of faulty locations is quite small.

The effect of the faulty locations is largely eliminated by the use of an auxiliary memory 13 and an associated address code converter 14. The address information from the address register 2 is applied to the address converter 14 over line 15. The address converter is set so that it provides an output address to the memory 13 only if the address which it is receiving is that of a previously detected faulty location in memory 1. In these circumstances, the converter also produces a signal on line 16 which is applied to the gating arrangement 6 to switch it so that the data output from memory 13 on line 17 is fed to the output highway 7, in place of the data output from memory 1, coming from the faulty location. The signal on the line 16 is also applied to the data checking device 8 to suppress its operation, which is not necessary because the correct data will have been read out from the mwemory 13.

The setting of the address converter and the loading of the correct data into the memory 13 is done in two ways. Firstly, the setting and loading is done periodically, for example, when the computer system is switched on each morning. If any of the memories in the system are volatile, such as semiconductor memories, it will be necessary to initialise them and the loading of the memory 13 can be part of this process.

The setting and loading information is stored in some non-volatile medium such as a disc file, and is read into the memory as part of the initiating process. Thus, the address converter will be set in accordance with all the known faulty locations in the memory 1 and the memory 2 will be loaded with whatever data is currently stored in those locations. If the data in the faulty locations is changed during the use of the computer system, the corresponding changes will be made in the memory 13, since the input highway 12 is also connected to the memory 13.

The memory system, including memory 1 and memory 13, will appear to be a fault-free system to the central processor, because the output highway 7 will receive the correct data from one or the other memory, so long as no further locations develop faults.

The occurrence of faults during the operation of the computer is dealt with in the following way. The occurrence of a fault causes the data checking device 8 to apply a signal over line 18 to the address converter 14 to set it in accordance with the address which is currently held in the address register 2, which is the address of the location which has shown the fault. The corrected data is applied to the input of the memory 13 from the data checking device 8, so that it will be loaded into a corresponding location of the memory 13.

Figure 2:
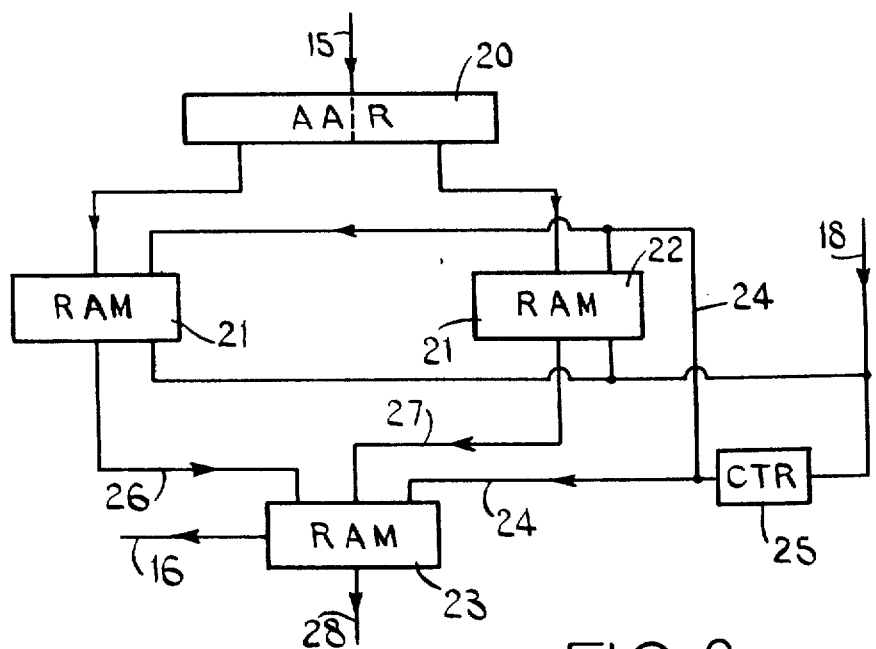
FIG. 2 is a schematic block diagram of a code conversion arrangement forming part of the memory system.

One form of address converter which may be used is shown in FIG. 2. The address information from the line 15 is applied to an auxiliary address register 20. This auxiliary register is provided primarily to allow the timing of the address converter 14 and memory 13 to be independent of that of the main memory 1.

The more significant half of the auxiliary address register 20 is connected to a random access memory 21 and the less significant half is connected to a similar memory 22. A data output channel of each of the two memories is connected to the address selection inputs of a further random access memory 23. The data inputs of all three memories 21, 22 and 23 are connected via line 24 to the output of a counter 25. The input of the counter 25 is connected to the line 18.

Merely for the sake of illustration, let it be assumed that the memory has 64 storage locations which are addressed in decimal code and that the memory 13 has four storage locations. Suppose that the first storage location of the memory 1 which is found to be faulty is location 47. The memories 21, 22 and 23 and the counter 25 are initially set to zero. The auxiliary register 20 will be set to 47, since that is the address in the address register 2. Accordingly, storage location 4 of memory 21 will be addressed by the more significant half of the register 20 and storage location 7 of memory 22, will be addressed by the less significant half of register 20.

The signal on the line 18 which indicates that an error has been detected will step the counter 25 to register one. The signal is also applied to the memories 21 and 22 to test if the addressed storage locations are registering zero. The setting of the counter 25 is transferred to the addressed storge locations, since they are registering zero. Once these storage locations are set, they read out over lines 26 and 27 which are connected to the address selection inputs of the memory 23. Hence, storage location 11 of memory 23 is selected, since each of the storage locations in memories 21 and 22 is generating a one.

The output of the counter 25 is also applied to the memory 23 as a data input, so that one is stored in location 11 of the memory. Once this storage location has been set, it will read out on line 28 to the address selection input of memory 13 to select location 1. Consequently, the corrected data on line 9 from the faulty location 47 of memory 1 is stored in location 11 of memory 23 to read out a one on line 25. This selects storage location 1 of memory 13, which reads out the appropriate data on line 17. The occurrence of an output from 23 generates a signal on line 16. This switches the gate 6 and suppresses operation of the data checking device 8 as already explained.

It is assumed that the memories 21, 22 and 23 have a shorter cycle that the memory 1. Accordingly, the signal on the line 16 will be effective to operate as described when the address converter has already been set. However, when the address converter has not been set previously, the signal on the line 16 will not occur until the setting has taken place and this will make it ineffective.

The memories 21, 22 and 23 are preferably self-timing semiconductor memories so arranged that the application of inputs from the register 2 will produce a short period of instability whilst the necessary switching occurs and a stable state is then achieved. However, those skilled in the art will find no difficulty in using other types of memory, the necessary sequence of operations being ensured by employing a suitable set of timing signals, if the memories require synchronisation.

Suppose that the next faulty storage location is location 19. The register 20 will select locations 1 and 9 in memories 21 and 22. These locations are both initialy zero and they will be set to two, since the counter 25 will have been stepped on. Accordingly, location 22 will be selected in memory 23 and will be set to two. This will select storage location 2 of the memory 13 to receive the data.

The next faulty location might be 27. The register 20 will select storage locations 2 and 7 in memories 21 and 22, respectively. Storage location 2 will be initially at zero and will be set to three since the counter 25 has been stepped on again. However, storage location 7 is not zero, since it was set to one as a result of the fault on location 47. Accordingly, it is left unchanged so that the previously entered pattern is not destroyed.

As a result, storage location 31 of the memory 23 will be selected and will be set to three to select storage location 3 of memory 13.

It will be clear from the foregoing that the function of the address converter 14 is to assign replacement locations in the auxiliary memory 13 for faulty locations in the main memory 1, and to convert the addresses of the faulty locations, when they appear in address register 2, into the addresses of the corresponding replacement locations.

In this particular example, the memory 22 requires to have ten storage locations (0–9), the memory 21 requires seven locations (0–6), and the memory 23 requires sixteen locations (11–14, 21–24, 31–34, and 41–44). Hence, the total number of locations in this arrangement is 33. This should be compared with the number of locations (64) which would be required if the converter 14 were replaced by a known form of code converter using only a single random-access memory as a conversion table. Thus, it will be seen that the use of multiple memories in accordance with the invention can lead to substantial savings in the member locations required in the converter 14. These savings can be even greater where the main memory is larger.

It will be appreciated that the sizes of the main and auxiliary memories will usually be very much larger than those quoted by way of example, and the sizes of the address conversion memories 21-23 will be increased correspondingly. Where the main memory is very large, the number of address conversion memories may be increased. For example, the output of the register 20 may be applied to four memories, which feed two memories, which in turn feed a single memory.

It will also be appreciated that the addressing is more likely to be on a binary rather than on a decimal basis. Furthermore, it should be understood that the various data and address lines shown in the drawings are actually multi-bit paths for parallel transmission of data or addresses.

In a modification of the arrangement shown in FIG. 2, the memory 23 may be replaced by a two-input comparator device (not shown). The memories 21 and 22 are set and are read out in the manner which has already been described. The lines 26 and 27 are connected to respective inputs of the comparator and to the inputs of two respective AND gates. The AND gates also receive respective outputs of the comparator and their outputs are combined in an OR gate, the result being applied to the line 28. The AND gate which is connected to the line 26 is enabled by the output of the comparator if the value on the line 26 is equal to or greater than the value on the line 27 and both values are not zero. Thus, the output of the memory 21 is fed to the line 28 under these conditions. The AND gate which is connected to the line 27 is enabled if the value on the line 26 is less than the value on the line 27 and both values are not zero. This modified arrangement will provide the same responses as the unmodified arrangement, but it also provides some additional false responses. For example, an input of 49 will read out one from memory 21 and two from memory 22, assuming that the settings for locations 47 and 19 have already been made as described earlier. Under these conditions the comparator and gating arrangement will read out two even though no setting was made for location 49.

Since the number of faulty locations is likely to be a small proportion of the total, it may well be that the active addresses can be so arranged that no difficulty is experienced. Alternatively, a checking routine may be used to determine if the pattern of faulty addresses will result in false responses and to eliminate such responses.

In a further modification, the comparator controls a single gate driven by one of the lines 26 or 27. The comparator operates the gate on an equals condition. This will operate without false responses, but it will not respond to subsequent settings which involve overlap of the address digits. Thus the setting for location 27, in the example, was three in memory 21 and one in memory 22. Clearly, this would not give an equals condition and the presence of 27 as an input would not call location 3 of memory 13, as it should.

In another modification of the invention, the counter 25 may be replaced by another form of data source. For example, the counter may be replaced by a logic arrangement which performs arithmetic or logical operations upon the input code on line 15, to provide an addressing system which resembles so-called "hash coding" systems. Alternatively, the counter may be replaced by a preloaded memory which is addressed by the input code on line 15.

It will be appreciated that code conversion arrangements in accordance with the invention may be used for other purposes apart from that of providing replacement addresses described above. For example, they may be used for translating virtual addresses into real addresses in a virtual memory system, or for decoding program instruction codes.

I claim:

1. A digital code conversion arrangement including a plurality of first memories, each said first memory having a plurality of first storage locations; addressing means operative in response to an input code having a plurality of portions to address each of the first memories with a different portion respectively of the input code and thereby select one of the first storage locaons in each of the first memories; a data source; input means operative in an initialising mode to enter data from the data source into the selected first storage location of each of said first memories; first reading means operative in an operating mode to read out the data from the selected first storage location of each first memory; and output means operative to derive an output code from the data read out by said first reading means from the selected first storage locations.

2. A code conversion arrangement according to claim 1 wherein the output means includes a second memory having a plurality of second storage locations; selection means operative in response to a combination of the data read out from the selected first storage locations of the first memories to select one of said second storage locations; means operative in the initialising mode to enter the data from the data source into the selected second storage location and operative in the operating mode to read out the data from the selected second storage location to provide the output code.

3. A code conversion arrangement according to claim 2 wherein the data source comprises a counter and means operative to increment the counter each time the data is entered into the first and second memories.

4. A memory system comprising:
a main memory having a plurality of addressable storage locations, some of which locations may be faulty; an address register for addressing the main memory; an auxiliary memory having a plurality of addressable storage locations smaller in number than the storage locations in the main memory; at least two further memories each having a plurality of further storage locations; addressing means operative to address each of the further memories with a different portion respectively of the contents of the address register to select one of the further storage locations in each of the further memories;
a data source;
an information checking device operative to check information read out from the storage locations of the main memory;
means operable to enter data from the data source into the selected further storage locations of each of the further memories and to read out the data from the selected further storage locations of the further memories to produce an address which is applied to the auxiliary memory in response to the information checking device indicating that an addressed location in the main memory is faulty; and
gating means operative to select information read out from the auxiliary store when the information checking device indicates that an addressed location in the main memory is faulty and operative to select information read out from the main memory when the information checking device indicates that the addressed location in the main memory is functioning correctly.

5. A memory system as claimed in claim 4 in which the data source comprises a counter and the data checking device is operative to increment the counter each time data is entered into the further memories from the data source.

* * * * *